US010847701B2

(12) United States Patent
Nevins et al.

(10) Patent No.: US 10,847,701 B2
(45) Date of Patent: Nov. 24, 2020

(54) SEMI-FLEXIBLE LIGHTING MODULE

(71) Applicant: Aura Technologies, LLC, Raleigh, NC (US)

(72) Inventors: Jeremy Nevins, Durham, NC (US); Thomas Place, Scottsdale, AZ (US); Douglas Bennett, Cary, NC (US); Brighton Owen, Greensboro, NC (US)

(73) Assignee: Aura Technologies, LLC, Raleigh, NC (US)

( * ) Notice: Subject to any disclaimer, the term of this patent is extended or adjusted under 35 U.S.C. 154(b) by 0 days.

(21) Appl. No.: 16/570,501

(22) Filed: Sep. 13, 2019

(65) Prior Publication Data

US 2020/0098962 A1    Mar. 26, 2020

Related U.S. Application Data

(60) Provisional application No. 62/732,608, filed on Sep. 18, 2018, provisional application No. 62/732,673, filed on Sep. 18, 2018.

(51) Int. Cl.
*H01L 33/62* (2010.01)
*H01L 25/075* (2006.01)
*H01L 33/64* (2010.01)
*H01L 33/00* (2010.01)

(52) U.S. Cl.
CPC .......... *H01L 33/62* (2013.01); *H01L 25/0753* (2013.01); *H01L 33/0095* (2013.01); *H01L 33/644* (2013.01); *H01L 2933/0066* (2013.01); *H01L 2933/0075* (2013.01)

(58) Field of Classification Search
CPC ............... H01L 33/62; H01L 25/0753; H01L 33/0095; H01L 33/644; H01L 2933/0075; H01L 2933/0066; H01L 33/642; H05K 1/00
USPC ................................... 257/79; 362/555, 543
See application file for complete search history.

(56) References Cited

U.S. PATENT DOCUMENTS

| | | | |
|---|---|---|---|
| 8,262,250 B2 | 9/2012 | Li et al. | |
| 8,851,356 B1 | 10/2014 | Holec et al. | |
| 9,194,566 B2 | 11/2015 | Oh | |
| 2012/0182755 A1* | 7/2012 | Wildner | F21V 5/045 362/555 |
| 2013/0329444 A1* | 12/2013 | Oh | F21S 43/195 362/543 |
| 2017/0205057 A1 | 7/2017 | Winkler et al. | |

FOREIGN PATENT DOCUMENTS

WO    2017062817 A1    4/2017

OTHER PUBLICATIONS

Leibson, "Hands on: Working with LED Ribbons Part 1—Creating Residential Under Cabinet Lighting," Digi-Key's North American Editors, available at.

* cited by examiner

*Primary Examiner* — Caleen O Sullivan
(74) *Attorney, Agent, or Firm* — Danielson Legal LLC

(57) ABSTRACT

Lighting modules and methods of manufacturing the same. The lighting module described herein may include a flexible printed circuit board substrate, light emitting diodes mounted on one side of the printed circuit board substrate, and thermally-conductive substrate plates opposite of the light emitting diodes to provide structural support and thermal management.

15 Claims, 4 Drawing Sheets

SEMI-FLEXIBLE LIGHTING MODULE

CROSS REFERENCE TO RELATED APPLICATIONS

The present application claims the benefit of and priority to U.S. provisional application No. 62/732,608, filed on Sep. 18, 2018, and U.S. provisional application No. 62/732,673, filed on Sep. 18, 2018, the entire disclosures of each of which are incorporated by reference as if set forth in their entirety herein.

TECHNICAL FIELD

Embodiments described herein generally relate to lighting modules and, more particularly but not exclusively, to semi-flexible lighting modules and methods of manufacturing the same.

BACKGROUND

Existing modular lighting units tend to be large with little or no concern for the efficiency or quality of light produced. For example, these existing lighting units tend to use fluorescent light, which has many drawbacks compared to light emitting diodes (LEDs). For example, fluorescent lights use approximately 20% more power than LEDs, generate more heat, produce ultraviolet light, have a shorter life span, contain toxic mercury, and exhibit a constant flickering effect. Additionally, many applications require lighting modules that are thin and have more versatile form factors to pair with existing equipment than existing lighting solutions provide.

A need exists, therefore, for devices and methods that overcome the disadvantages of existing lighting solutions.

SUMMARY

This summary is provided to introduce a selection of concepts in a simplified form that are further described below in the Detailed Description section. This summary is not intended to identify or exclude key features or essential features of the claimed subject matter, nor is it intended to be used as an aid in determining the scope of the claimed subject matter.

In one aspect, embodiments relate to a lighting module. The lighting module includes a flexible printed circuit board (PCB), a plurality of electrical connections on a first side of the flexible PCB, a light source operably attached to each of the plurality of electrical connections, and a plurality of thermally-conductive substrate plates that are each operably attached to a second side of the flexible PCB opposite an electrical connection to provide structural support and thermal management.

In some embodiments, the plurality of rigid thermally-conductive substrate plates are separated from each other by a gap to enable flexibility of the PCB.

In some embodiments, each of the plurality of thermally-conductive substrate plates are operably attached to the second side of the flexible PCB by at least one of epoxy and die-cut tape.

In some embodiments, the lighting module further includes a plurality of semi-rigid material portions that are each positioned to contact a thermally-conductive substrate plate and the PCB.

In some embodiments, the flexible PCB may be embedded in at least one of tents, campers, recreational vehicles, umbrellas, shades, awnings, work sites, boats, and crawl spaces.

In some embodiments, the lighting module further includes a connection mechanism to enable the lighting module to be connected to at least a second lighting module. In some embodiments, the lighting module further includes a driver configured to control light output based on the number of connected lighting modules.

In some embodiments, the light sources are soldered onto the plurality of electrical connections.

In some embodiments, the electrical connections include solder joints.

According to another aspect, embodiments relate to a lighting module. The lighting module includes at least two flexible printed circuit boards (PCBs); a thermally-conductive substrate, wherein the at least two flexible PCBs are operably attached to the thermally-conductive substrate on a first side of the substrate; and a light source operably attached to the substrate on the first side of the substrate and positioned between the at least two flexible PCBs.

According to yet another aspect, embodiments relate to a method of manufacturing a lighting module. The method includes providing a flexible printed circuit board (PCB), creating a plurality of electrical connections on a first side of the PCB, attaching a light emitting diode (LED) to each to the plurality of electrical connections on the first side of the PCB, and operably attaching a plurality thermally-conductive substrate plates to a second side of the flexible PCB, each opposite an electrical connection to provide structural support and thermal management.

In some embodiments, the plurality of rigid thermally-conductive substrate plates are separated from each other by a gap to enable flexibility of the PCB.

In some embodiments, each of the plurality of thermally-conductive substrate plates are operably attached to the second side of the flexible PCB by at least one of epoxy and die-cut tape.

In some embodiments, the method further includes attaching a plurality of semi-rigid material portions that are each positioned to contact a thermally-conductive substrate plate and the PCB.

In some embodiments, the method further includes embedding the lighting module in a location selected from the group consisting of a tent, camper, recreational vehicle, umbrella, shade, awning, work site, boat, and crawl space.

In some embodiments, the method further includes configuring the lighting module with a connection mechanism to enable the lighting module to be connected to at least a second lighting module. In some embodiments, the method further includes operably connecting a driver to the lighting module to control light output based on the number of connected lighting modules.

In some embodiments, the LEDs are soldered onto the plurality of electrical connections.

In some embodiments, the electrical connections include solder joints.

BRIEF DESCRIPTION OF DRAWINGS

Non-limiting and non-exhaustive embodiments of this disclosure are described with reference to the following figures, wherein like reference numerals refer to like parts throughout the various views unless otherwise specified.

DETAILED DESCRIPTION

Figure 1:
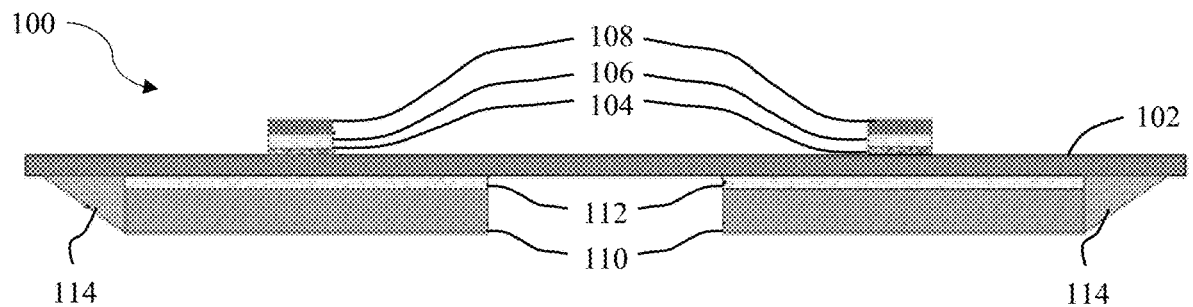
FIG. 1 illustrates a lighting module in accordance with one embodiment.

Various embodiments are described more fully below with reference to the accompanying drawings, which form a part hereof, and which show specific exemplary embodiments. However, the concepts of the present disclosure may be implemented in many different forms and should not be construed as limited to the embodiments set forth herein; rather, these embodiments are provided as part of a thorough and complete disclosure, to fully convey the scope of the concepts, techniques and implementations of the present disclosure to those skilled in the art. Embodiments may be practiced as methods, systems or devices. Accordingly, embodiments may take the form of a hardware implementation, an entirely software implementation or an implementation combining software and hardware aspects. The following detailed description is, therefore, not to be taken in a limiting sense.

Reference in the specification to "one embodiment" or to "an embodiment" means that a particular feature, structure, or characteristic described in connection with the embodiments is included in at least one example implementation or technique in accordance with the present disclosure. The appearances of the phrase "in one embodiment" in various places in the specification are not necessarily all referring to the same embodiment. The appearances of the phrase "in some embodiments" in various places in the specification are not necessarily all referring to the same embodiments.

In addition, the language used in the specification has been principally selected for readability and instructional purposes and may not have been selected to delineate or circumscribe the disclosed subject matter. Accordingly, the present disclosure is intended to be illustrative, and not limiting, of the scope of the concepts discussed herein.

As discussed above, existing lighting modules generally rely on fluorescent light and are unable to be used in different types of locations. Additionally, existing lighting modules cannot be readily embedded or otherwise used in conjunction with different types of objects or in different types of applications.

The embodiments described herein on the other hand provide a semi-flexible lighting module that can be used in a variety of applications. Specifically, the lighting module in accordance with various embodiments includes a flexible printed circuit board substrate (for simplicity, "PCB"), electrical connections on one side of the PCB with light sources such as light emitting diodes (for simplicity, "LEDs") thereon, and thermally-conductive substrate plates on the other side of the PCB opposite one or more of the LEDs.

The thermally-conductive substrate plates may be separated by a gap to allow the PCB to bend or fold, but also provide some structural support and thermal management of the heat generated by the LEDs. Accordingly, the substrate plates may act as heat sinks to enable the reliable and efficient operation of the lighting module at high power, while also reducing strain on LED solder joints. This may be particularly important as the solder joints may be under strain during flexion.

Additionally, the flexible materials keep the lighting module thin compared to, for example, a large, rigid glass structure. This reduces the weight of the lighting module while also permitting a greater level of flexibility than possible with glass structures.

The achieved flexibility allows the lighting module as a whole to be more resilient and embedded in fabrics such as in the wall of a tent, all without the added weight and size of metal components. The lighting module may similarly be embedded in a variety of other applications such as campers, recreational vehicles, umbrellas, shades, sheds, awnings, work sites, boats, crawl spaces, or any other type of environment needing a light source.

FIG. 1 illustrates a lighting module 100 in accordance with one embodiment. The lighting module 100 may include at least one flexible PCB 102 that includes a conductive circuit therein and a plurality of joints or solder pads 104. The solder pads 104 may each have a layer of solder 106 disposed thereon such that light sources 108 can be operably connected to the solder pads 104.

All dimensions, materials, and quantities of the lighting module 100 may vary to accomplish the objectives of a specific application. In one embodiment, the PCB 102 may be approximately 12 inches long, approximately two inches wide, and include six light sources 108. In this embodiment, the light sources 108 may be wired in series and spaced evenly across the length of the PCB 102.

The type of light sources 108 used may vary as long as they can provide the required amount of light. In some embodiments, the light sources 108 may include LEDs. These may include high power LEDs such as those capable of utilizing more than 0.5 W. These may include low-profile CSP-style (Chip Scale Package) or other type of flat lens LEDs to allow the lighting module 100 to be thinner and more durable.

On the opposite side, the PCB 102 may include a plurality of thermally-conductive substrate plates 110. These may be, for example, rigid ceramic plates or metal-core substrates. The substrate plates 110 may be attached to the PCB 102 via any appropriate adhesive 112 such as a thermally conductive two-part epoxy, die-cut tape, or the like. The type of adhesive 112 may vary and may include any type of appropriate substance, whether available now or invented hereafter, as long as the objectives of the embodiments described herein may be accomplished.

As seen in FIG. 1, the substrate plates 110 may be spaced apart from each other such that there is a gap therebetween. The gap between the substrate plates 110 reduces the weight of the lighting module 100 and allows the lighting module 100 to bend or fold to be used in a variety of different configurations. Accordingly, the substrate plates 110 allow the lighting module 100 to be semi-rigid but also flexible.

The substrate plates 110 can provide mechanical support and can also be thermally conductive. For example, the substrate plates 110 may be formed of aluminum to direct heat away from the light sources 108. This enables higher power output levels while helping improve reliability and efficiency.

Further strain relief may be provided at the joint of the substrate plates 110 by one or more semi-rigid material portions 114, as seen in FIG. 1. The semi-rigid material portions 114 may be formed of injection-molded rubber or silicone, for example. As seen in FIG. 1, the semi-rigid material portions 114 may contact the PCB 102 and the substrate plates 110 to prevent the PCB 100 from bending to a prohibitively sharp radius at that point of contact. This further reduces strain on the point of flexion and increases the robustness of the lighting module 100.

The size and shape of the semi-rigid material portions 114 may vary and may depend on the application. However, the semi-rigid material portions 114 are not required in all embodiments.

Figure 2:
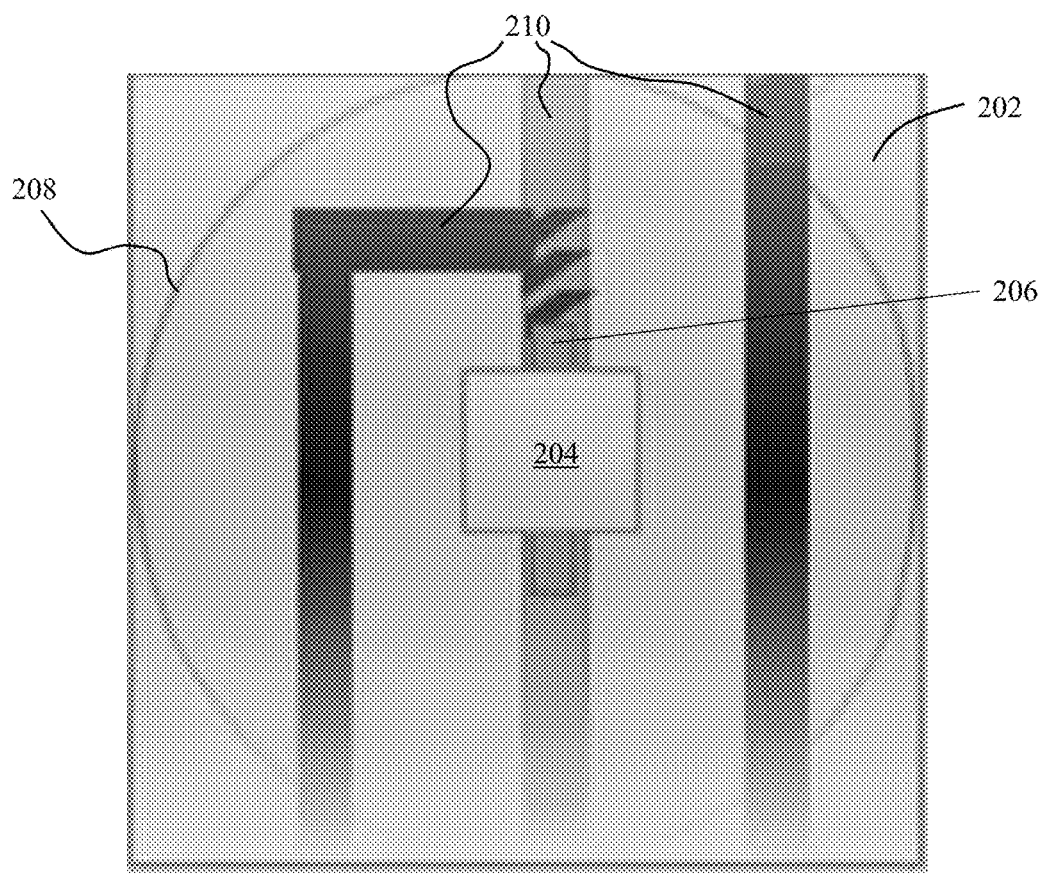
FIG. 2 illustrates a top view of a portion of a printed circuit board in accordance with one embodiment.

FIG. 2 illustrates a top view of a portion of a PCB 202 such as the PCB 102 of FIG. 1 in accordance with one embodiment. As seen in FIG. 2, an LED 204 is soldered onto a solder pad 206 located on a copper trace on the PCB 202. This pad 206 or joint may provide the primary electrical and thermal contact for the LED 204. In some embodiments, the PCB 202 may further include a white mounting surface 208 to increase reflectivity and the overall efficiency of the lighting module. Also shown in FIG. 2 are a plurality of wires 210 that provide power to the LED 204.

Although not shown in FIGS. 1 and 2, the lighting module in accordance with various embodiments may include or otherwise be configured with connection mechanisms such that two or more PCBs may be connected to form an array or bank of lighting modules. Arrays can be made modular through connections between multiple light modules with individual flex PCBs or connectors.

For example, a lighting module with a string of six series-connected LEDs can have one or more connections that allow a neighboring lighting module to attach electrically, thereby expanding the array size, enabling higher light output, and lowering glare through reduced individual intensity for the same total fixture output. The lighting modules can be connected in series, parallel, or both, depending on the application's requirements.

For example, multiple connections can be utilized to allow two individual lighting modules that include strings of series-connected LEDs to be connected such that each LED is connected in parallel with another individual LED. This may create a string with enhanced reliability by creating LED circuits that are connected in series such that if one LED fails short, only two LEDs will go out and the strings will remain balanced (i.e., such that one string is not taking a significantly higher amount of current). This will keep each of the LEDs running at a balanced drive current, thereby reducing the opportunity for cascading failures in which one LED failure causes a string to receive prohibitively higher current, burning out the remaining LEDs in the string.

In some embodiments, the lighting modules could be connected in full series. This may create a string of lighting modules that allows a driver to operate at higher output voltage while keeping drive current constant for increased output, or lower for the same output requirements. The driver also provides a fail-safe system that can continue operating even if one module is damaged or otherwise fails. Wiring each module in series and each neighboring LED in parallel creates a network that, in the event of an LED failure, will still operate with a minimum number of LEDs turning off.

In some embodiments, a driver can be mounted externally to the lighting module(s). In other embodiments, the driver may be an on-board device that is configured with a lighting module. In this case, the driver may have a thin form factor so as to minimize the size and weight of the overall lighting module or string of lighting modules.

Regardless of the exact configuration, the driver may sense the addition of light modules based on string voltage. Or, the driver may sense the addition of light modules based on an increase in drive current as more light modules are installed and connect with each other.

The driver may maintain power output while also reducing surface intensity. For example, if the drive current is not increased and new modules are added, power must be distributed across more LEDs. This inevitably results a lower drive current, higher efficiency, and less intensity from each LED. This also keeps the current balanced between the remaining, active strings.

Figure 3:
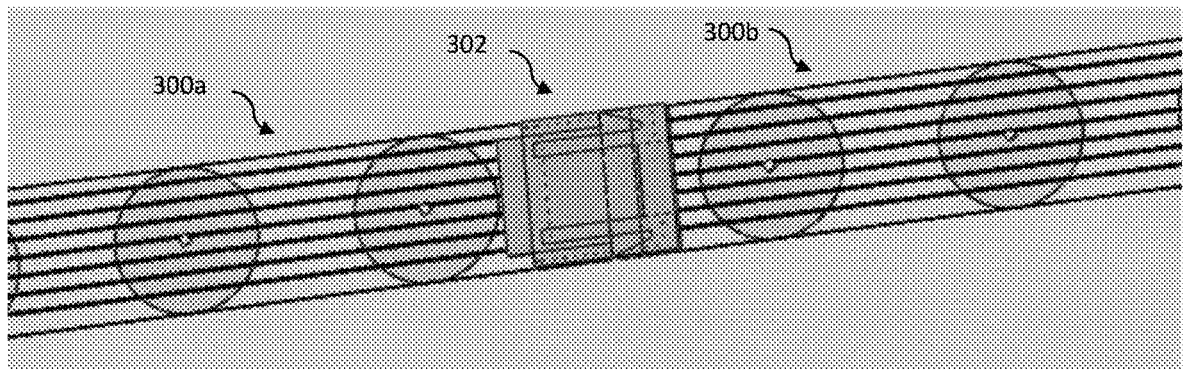
FIG. 3 illustrates two connected lighting modules in accordance with one embodiment.

FIG. 3 illustrates multiple lighting modules 300a and 300b connected with each other. The lighting modules 300a-b may be similar to the lighting modules of FIG. 1, for example. As seen in FIG. 3, a single lighting module may be configured with a connection mechanism 302 (e.g., male and female connectors) to connect with other modules.

The module 300a may be shaped such that one ribbon connector comes out from each end to connect to an adjacent module 300b. Electrical connections may form through the connection mechanisms 302 such that light sources are connected in parallel to the adjacent light source on the neighboring module. As alluded to above, this keeps the total string voltages even across a lighting module array instead of causing a single string to use a high amount of current, which would result in a shorter lifespan and significantly decreased efficiency.

Figure 4:
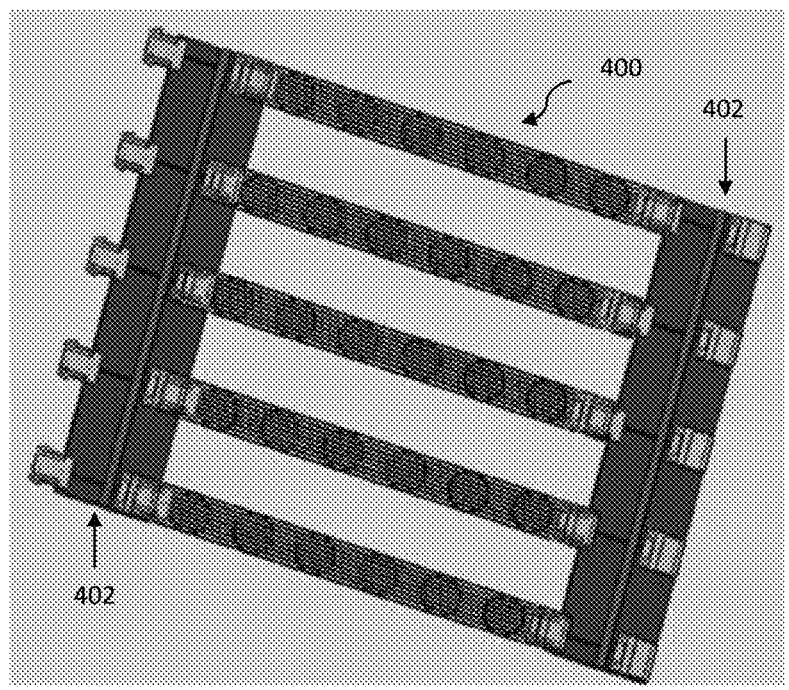
FIG. 4 illustrates an array of a plurality of lighting modules in accordance with one embodiment.

In some embodiments, such as the one illustrated in FIG. 4, multiple lighting modules 400 may be connected to connection frames 402 in a variety of configurations. As seen in the configuration of FIG. 4, a plurality of lighting modules 400 such as those of FIG. 3 are in parallel with each other.

Figure 5:
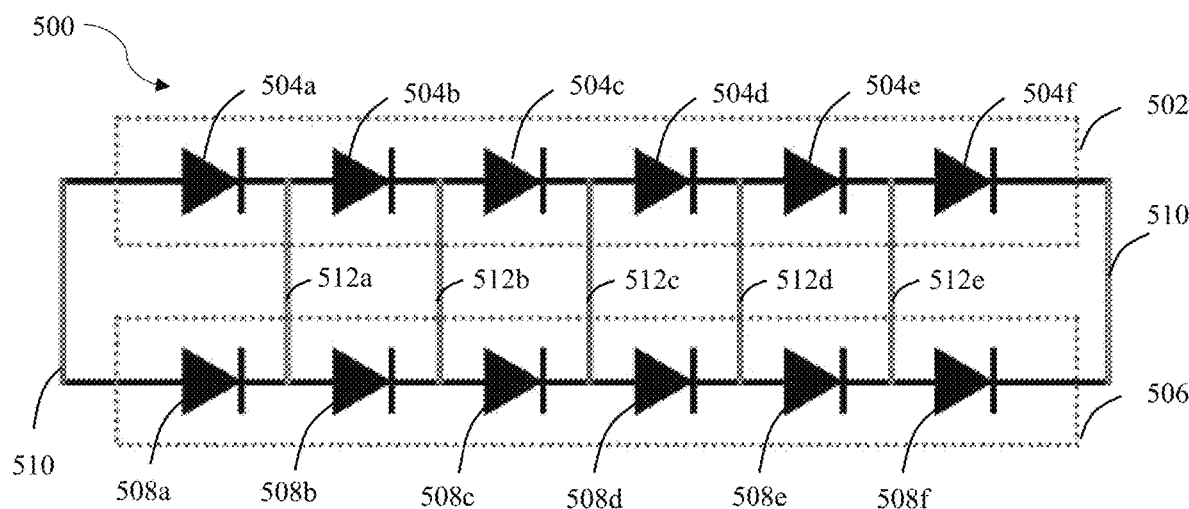
FIG. 5 illustrates a diagram of two lighting modules in accordance with one embodiment.

FIG. 5 illustrates a diagram 500 of a lighting module 502 with a plurality of light sources 504a-f and lighting module 506 with a plurality of light sources 508a-f. The lighting modules 502 and 506 may be similar to the lighting module 100 of FIG. 1. As seen in FIG. 5, the light sources 504a-f and 508a-f are wired in series and are connected to each other in parallel by connections 510.

In the configuration shown in FIG. 5, traces on the PCBs of the lighting modules 502 and 506 can be routed such that each light source node is individually addressable. Accordingly, each light source node also wired in a parallel as shown by connections 512a-e.

In this scenario, if one light source fails short, then it will short its associated node so that the neighboring light source will also go out. This will result in ten light sources staying evenly lit with no imbalances.

If, however, the connections 512a-e were removed and only the ends of the lighting sources 502 and 506 were connected, a single light source failure will result in a string with five operable light sources in parallel with a string with six lights. The string with five operable light sources would therefore take the overwhelming majority of the current as the total forward voltage required to turn on the string is much lower and both strings would receive the same voltage. Accordingly, one string would be much brighter than the other, which would cause the brighter string to run much hotter and potentially fail faster.

Figure 6:
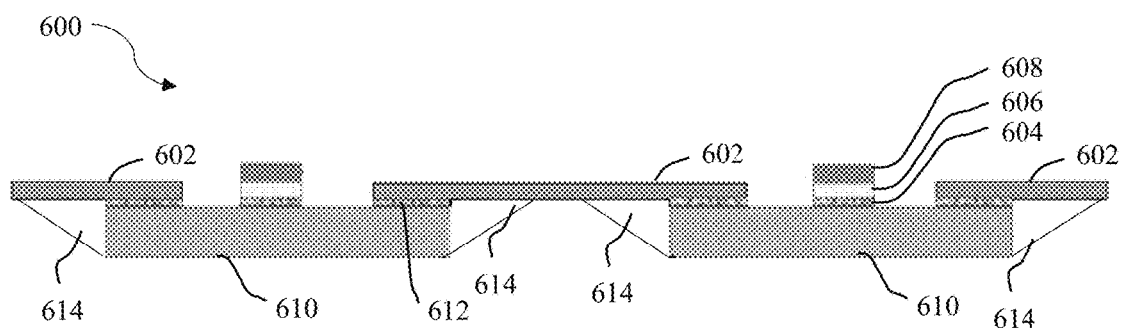
FIG. 6 illustrates a lighting module in accordance with another embodiment.

FIG. 6 illustrates a lighting module 600 in accordance with another embodiment. The lighting module 600 of FIG. 6 may include similar components to those of the lighting module 100 of FIG. 1. For example, the lighting module 600 of FIG. 6 may include multiple PCBs 602, joints or solder pads 604, solder 606, and light sources 608 soldered onto the pads 604.

However, the light sources 608 and pads 604 of the lighting module 600 are not positioned on the PCB 602 as in FIG. 1, but are instead positioned on thermally-conductive substrate plates 610. As seen in FIG. 6, these PCBs 602 are connected between the substrate plates 610 by an adhesive 612. This configuration may allow for a more direct thermal path to the substrate plates 610 for heat generated by the light sources 608. Additionally, the PCBs 602 act as a "harness" that connects between the light sources 608 while the substrate plates 610 extend between the flexible connections of the PCBs 602. The lighting module 600 may further include semi-rigid portions 614 that are similar to the semi-rigid material portions 114 of FIG. 1.

The lighting module 600 is similar to the lighting module 100 of FIG. 1. However, the construction of the lighting module 600 of FIG. 6 achieves different benefits. For one, the placement of the light sources 608 directly on the substrate plates 610 reduces handling damage of an unsupported flexible PCB 602. Another advantage with the configuration of FIG. 6 is that it allows for the replacement of an individual LED plate more easily after construction.

Figure 7:
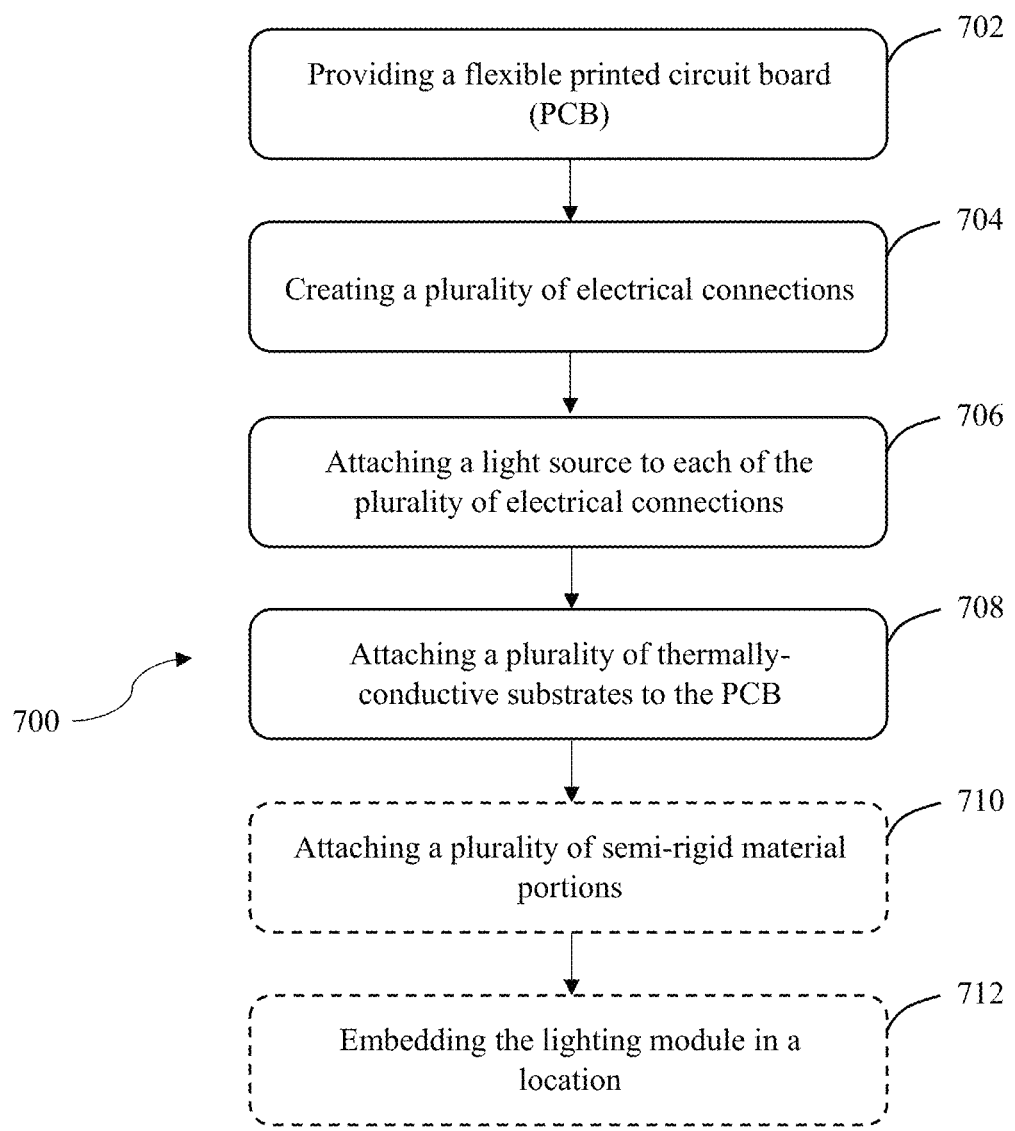
FIG. 7 depicts a flowchart of a method of manufacturing a lighting module in accordance with another embodiment.

FIG. 7 depicts a flowchart of a method 700 of manufacturing a lighting module in accordance with one embodiment. The lighting module manufactured by method 700 may be similar to the lighting module 100 of FIG. 1, for example. Step 702 involves providing a flexible printed circuit board (PCB). The PCB may be similar to the PCB of FIG. 1 or 6, for example.

Step 704 involves creating a plurality of electrical connections on a first side of the PCB. The electrical connections may be formed from solder pads or joints mounted on the PCB. These solder pads or joints may be similar to those of FIG. 1, for example.

Step 706 involves attaching a light source to each to the plurality of electrical connections on the first side of the PCB. The number and size of the light sources may vary and may depend on the application. In some embodiments, the light sources may be LEDs and may be soldered onto the PCB to create the electrical connections.

Step 708 involves operably attaching a plurality thermally-conductive substrate plates to a second side of the flexible PCB, with each plate opposite one of the plurality of electrical connections to provide structural support and thermal management. The number and size of the substrate plates may vary and may depend on the application.

As discussed above, the substrate plates may be placed opposite the light sources. This not only provides structural support for the lighting module, but also acts as a heat sink to manage heat generated by the light sources.

As seen in FIG. 1, the substrate plate(s) may not run the entire length of the PCB. Rather, the lighting module may include multiple substrate plates that are spaced apart from each other. This provides some level of structural support, but also enables the lighting module to fold or bend in a variety of ways. This allows the lighting module to be embedded in a variety of fabrics or used in different applications that may require lighting module flexibility.

For example, the lighting module may be sewn into or otherwise embedded in the walls of a tent. Accordingly, the lighting module can be deployed when the tent is set up and stowed away as part of the tent when the tent is taken down.

Step 710 involves attaching a plurality of semi-rigid material portions that are each positioned to contact a thermally-conductive substrate plate and the PCB. These semi-rigid material portions may be formed of silicone and may be similar to the portions 114 of FIG. 1, for example.

These semi-rigid portions provide an additional level of structural support by virtue of their placement. That is, they may be positioned to prevent the PCB from bending too much so as to directly contact a side of a substrate plate.

Step 712 involves embedding the lighting module in a location selected from the group consisting of a tent, camper, recreational vehicle, umbrella, shade, awning, work site, boat, crawl space, or any other type of environment needing a light source. As discussed above, the lighting module in accordance with various embodiments may be implemented in a variety of applications. In some embodiments, the lighting module may be sewn into or otherwise embedded in fabrics such as those part of a tent, awning, or umbrella. In other embodiments, the lighting module may be embedded in or otherwise attached to solid structures such as vehicles. The above list is merely exemplary, and the lighting module may be embedded in a variety of other types of locations in addition to those mentioned above.

The lighting module may be placed in any type of housing required to protect it from certain environmental constraints. Or, in other embodiments, the lighting module may use other means such as hook-and-loop fasteners or magnets attached to the substrate plates to attach to an external object. This allows for easy and repeatable attachment/detachment from mounting surfaces.

The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known structures and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Having described several example configurations, various modifications, alternative constructions, and equivalents may be used without departing from the spirit of the disclosure. For example, the above elements may be components of a larger system, wherein other rules may take precedence over or otherwise modify the application of various implementations or techniques of the present disclosure. Also, a number of steps may be undertaken before, during, or after the above elements are considered.

Having been provided with the description and illustration of the present application, one skilled in the art may envision variations, modifications, and alternate embodiments falling within the general inventive concept discussed in this application that do not depart from the scope of the following claims.

What is claimed is:

1. A lighting module comprising:
   a flexible printed circuit board (PCB);
   a plurality of electrical connections on a first side of the flexible PCB;
   a light source operably attached to at least two of the plurality of electrical connections;
   a plurality of thermally-conductive substrate plates that are each operably attached to a second side of the flexible PCB opposite an electrical connection to provide structural support and thermal management;
   a connection mechanism to enable the lighting module to be connected to at least a second lighting module; and
   a driver configured to control light output based on the number of connected lighting modules.

2. The lighting module of claim 1 wherein the plurality of rigid thermally-conductive substrate plates are separated from each other by a gap to enable flexibility of the PCB.

3. The lighting module of claim 1 wherein each of the plurality of thermally-conductive substrate plates are operably attached to the second side of the flexible PCB by at least one of epoxy and die-cut tape.

4. The lighting module claim 1 further comprising a plurality of semi-rigid material portions that are each positioned to contact a thermally-conductive substrate plate and the PCB.

5. The lighting module of claim 1 wherein the flexible PCB may be embedded in at least one of tents, campers, recreational vehicles, umbrellas, shades, awnings, work sites, boats, and crawl spaces.

6. The lighting module of claim 1 wherein the light sources are soldered onto the plurality of electrical connections.

7. The lighting module of claim 1 wherein the electrical connections include solder joints.

8. A lighting module comprising:
   at least two flexible printed circuit boards (PCBs);
   a thermally-conductive substrate, wherein the at least two flexible PCBs are operably attached to the thermally-conductive substrate on a first side of the substrate; and
   a light source operably attached to the substrate on the first side of the substrate and positioned between the at least two flexible PCBs.

9. A method of manufacturing a lighting module, the method comprising:
   providing a flexible printed circuit board (PCB);
   creating a plurality of electrical connections on a first side of the PCB;
   attaching a light emitting diode (LED) to at least two of the plurality of electrical connections on the first side of the PCB;
   operably attaching a plurality thermally-conductive substrate plates to a second side of the flexible PCB, each opposite an electrical connection to provide structural support and thermal management;
   configuring the lighting module with a connection mechanism to enable the lighting module to be connected to at least a second lighting module; and
   operably connecting a driver to the lighting module to control light output based on the number of connected lighting modules.

10. The method of claim 9 wherein the plurality of rigid thermally-conductive substrate plates are separated from each other by a gap to enable flexibility of the PCB.

11. The method of claim 9 wherein each of the plurality of thermally-conductive substrate plates are operably attached to the second side of the flexible PCB by at least one of epoxy and die-cut tape.

12. The method of claim 9 further comprising attaching a plurality of semi-rigid material portions that are each positioned to contact a thermally-conductive substrate plate and the PCB.

13. The method of claim 9 further comprising embedding the lighting module in a location selected from the group consisting of a tent, camper, recreational vehicle, umbrella, shade, awning, work site, boat, and crawl space.

14. The method of claim 9 wherein the LEDs are soldered onto the plurality of electrical connections.

15. The method of claim 9 wherein the electrical connections include solder joints.

* * * * *